United States Patent [19]
Mizuno et al.

[11] Patent Number: 5,844,278
[45] Date of Patent: Dec. 1, 1998

[54] SEMICONDUCTOR DEVICE HAVING A PROJECTING ELEMENT REGION

[75] Inventors: Tomohisa Mizuno; Yukihiro Ushiku, both of Yokohama; Makoto Yoshimi, Tokyo; Mamoru Terauchi, Yokosuka; Shigeru Kawanaka, Fujisawa, all of Japan

[73] Assignee: Kabushiki Kaisha Toshiba, Kawasaki, Japan

[21] Appl. No.: 527,636

[22] Filed: Sep. 13, 1995

[30] Foreign Application Priority Data

Sep. 14, 1994 [JP] Japan .................................. 6-220632
Sep. 11, 1995 [JP] Japan .................................. 7-232506

[51] Int. Cl.$^6$ .......................... H01L 29/76; H01L 29/94; H01L 31/062
[52] U.S. Cl. .......................... 257/345; 257/376; 257/394
[58] Field of Search .................................. 257/335, 336, 257/337, 343, 344, 347, 350, 394, 376

[56] References Cited

U.S. PATENT DOCUMENTS 4,979,014 12/1990 Hieda et al. ............................ 257/394
5,463,241 10/1995 Kubo ...................................... 257/376
5,512,770 4/1996 Hong ...................................... 257/408

FOREIGN PATENT DOCUMENTS 2-263473 10/1990 Japan .

OTHER PUBLICATIONS

Digh Hisamoto et al. "A Fully Depleted Lean–channel Transistor (DELTA)—A novel vertical ultra thin SOI Mosfet—," IEDM, pp. 833–836, Dec. 3, 1989.

*Primary Examiner*—Wael Fahmy
*Attorney, Agent, or Firm*—Oblon, Spivak, McClelland, Maier & Neustadt, P.C.

[57] ABSTRACT

The present invention provides a semiconductor device which includes a substrate having a projection-shaped semiconductor element region, a gate electrode formed through a gate insulating film on the upper face and side face of the element region, and a first conductivity type source region and drain region provided in a manner to form a channel region on the upper face of the element region across the gate electrode, and which has a high concentration impurity region containing a second conductivity type impurity at a concentration higher than that on the surface of the channel region in the central part of the projection-shaped semiconductor element region.

16 Claims, 8 Drawing Sheets

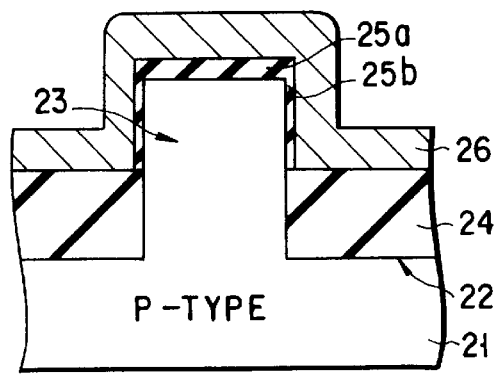
F I G. 8A
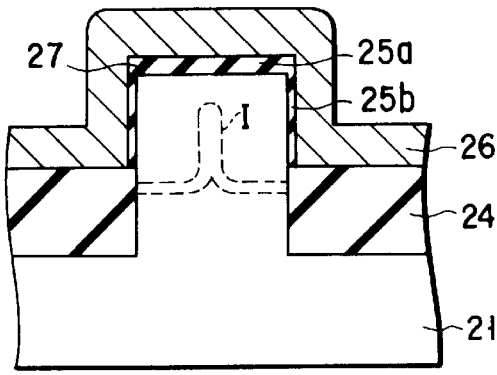
F I G. 8B
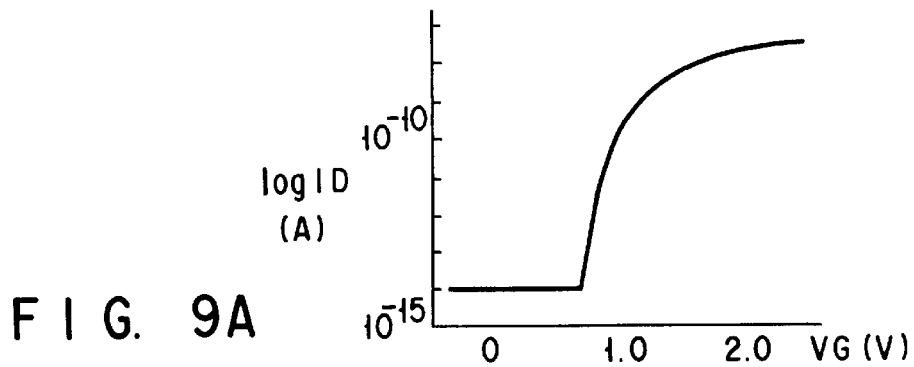
F I G. 9A
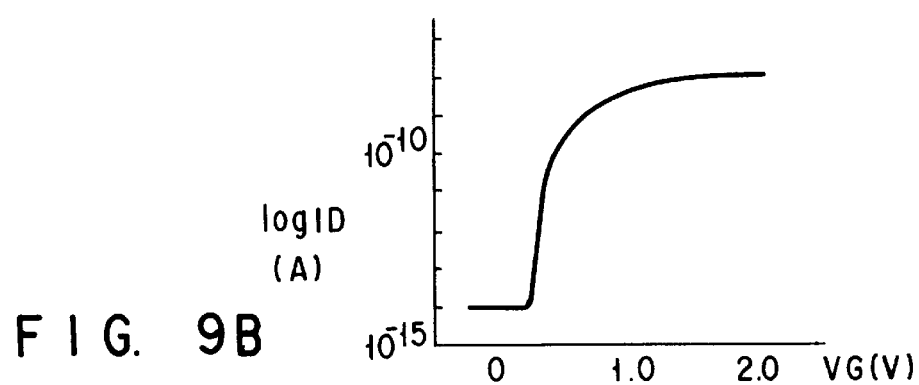
F I G. 9B
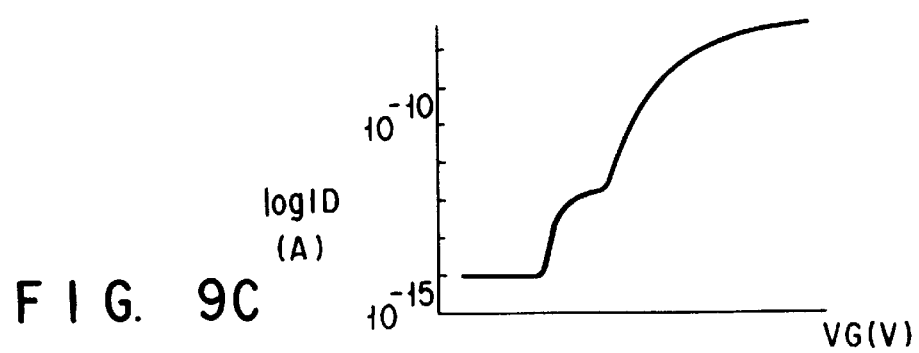
F I G. 9C

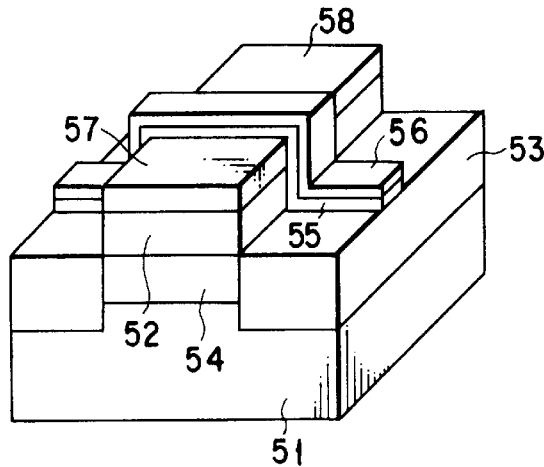
F I G. 17
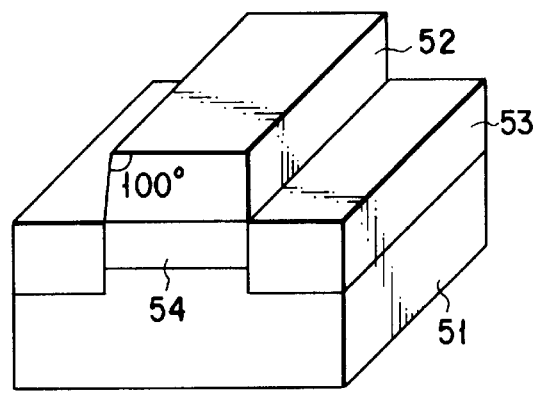
F I G. 18
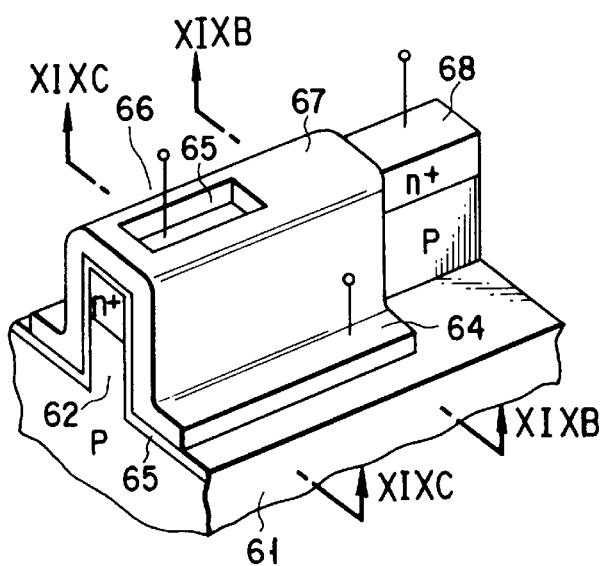
F I G. 19A
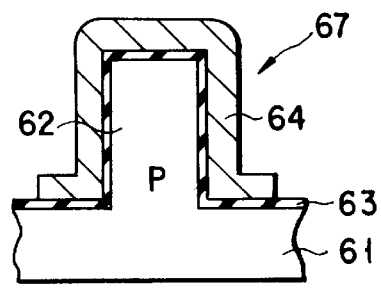
F I G. 19B
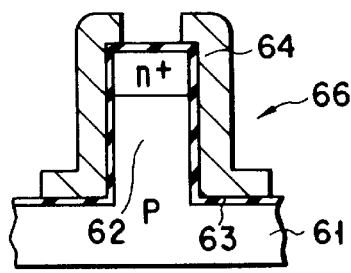
F I G. 19C

SEMICONDUCTOR DEVICE HAVING A PROJECTING ELEMENT REGION

BACKGROUND OF THE INVENTION

1. Field of the Invention

The present invention relates to a semiconductor device, and particularly to an improved structure of a MOS transistor.

2. Description of the Related Art

Heretofore, in a MOS integrated circuit, particularly a MOS transistor, by fine configuring of elements, there have been achieved high-rate circuit operation and low consumed power as well as high integration. FIG. 1 shows a MOS transistor having a conventional planar structure. In the MOS transistor, as shown in FIG. 17 a gate electrode 103 is formed through a gate insulating film 102 on a semiconductor substrate 101, and element isolation is made by a field oxide film 104.

In such a structure, as the fine configuring of elements progresses, problems develop. As typical factors of the problems, there can be given the film thickness of the gate insulating film 102 and the impurity concentration in the semiconductor substrate 101. With respect to the film thickness of the gate insulating film 102, there is a problem that as elements are finely configured, the thickness becomes thinner, and when the thickness becomes 4 nm or less, a direct tunneling phenomenon occurs to cause a gate current to flow through the semiconductor substrate 101, so that a stable circuit operation is not executed. Also, with respect to the impurity concentration, there is a problem that as elements are finely configured, the concentration becomes higher, and when the concentration in the substrate exceeds about $10^{18}$ cm$^{-3}$, a leak current due to tunneling flows between a source-drain diffused layer and the semiconductor substrate 101. Therefore, it is considered difficult that the MOS transistor having a conventional planar structure is made finely configured to a gate length 0.1 μm or less, due to a restriction of the film thickness of gate insulating film, the impurity concentration of semiconductor substrate and a short channel effect.

With consideration to the above-mentioned problems, in order to further enhance the fine configuring of elements, there has been proposed a ,MOS transistor having a structure as shown in FIGS. 2A and 2B (for-example, Jpn. Pat. Appln. KOKAI Publication Nos. 64-42176 and 64-27270). The MOS transistor is configured by a processing in which a groove which becomes an element isolation region is formed in a semiconductor substrate 5 to form a projection part 105a; a polycrystalline polysilicon film is embedded through an insulating film in the groove, or a silicon oxide film is directly embedded in the groove; through a gate insulating film 109 formed on the upper part and side part of the projection part 105a, a gate electrode 106 is formed; and utilizing the gate electrode 106 as a mask, a source region 107 and a drain region 108 are formed. The MOS transistor having such a configuration (hereinafter abbreviated as a projection-shaped transistor) has a good cut-off characteristics.

Also, in the projection-shaped transistor, by setting the width of the projection part 105a in such a manner that all the projection part 105a in an element region is depleted by a depletion layer extending from a gate electrode, an effect on the gate electrode for channel potential can be increased, with the result that an effect of a drain electrode may be reduced to restrain the short channel effect. Further, in the projection-shaped transistor, a current flows through the surface of the projection part 105a and thus the current on the side face can be utilized, so that a current larger than with a MOS transistor having a common planar structure can flow through.

However, in a conventional projection-shaped transistor, there is a problem as described below. That is, first, the decision of a threshold limit value depends on channel width. For this reason, the degree of freedom for the threshold limit value control is small. Particularly, where channel width is wide, an incidental transistor on the side part operates, so that a hump occurs in a characteristic chart showing a relationship between current and voltage.

Second, in the region of the projection part 105a which is not covered with the gate electrode 106, that is, since a region located deeper than the projecting region surrounded by the gate electrode 106 cannot be controlled by the gate electrode 106, the short channel effect due to a punch-through phenomenon occurs between the source region 107 and the drain region 108. For this reason, the fine configuring of gate length becomes difficult to execute.

Third, in the region located deeper than the projecting region surrounded by the gate electrode 106, when a drain voltage is allowed to increase, an electric force line extending from the drain region 108 moves toward the source region 107, so that only the gate electrode 106 cannot sufficiently restrain a variation in channel potential due to drain voltage. Particularly, for a short channel, a width L of the gate electrode 106 in the direction of the source region 107 to the drain region 108 is short, so that the element characteristics are not so improved as expected.

SUMMARY OF THE INVENTION

The present invention is made in view of such problems, and it is an object of the invention to provide a semiconductor device which can restrain a short channel effect due to a punch-through phenomenon and improve the element characteristics.

A first aspect of the present invention provides a semiconductor device comprising: a substrate having a semiconductor element region of a projection shape; a gate electrode formed on an upper surface and a side surface of the element region via a gate insulation film; and a source region and a drain region, of a first conductivity type, provided so as to form a channel region on the upper surface of the element region in such a manner that the gate electrode is interposed between the source region and the drain region; wherein the semiconductor device comprises a high concentration impurity region formed within a section of the projection shape and underneath the channel region, and having an impurity of a second conductivity type at a concentration higher than that of the channel region.

A second aspect of the present invention provides a semiconductor device comprising: a substrate having a semiconductor element region of a projection shape; a gate electrode formed on an upper surface and a side surface of the element region via a gate insulation film; and a source region and a drain region, of a first conductivity type, provided so as to form a channel region on the upper surface of the element region in such a manner that the gate electrode is interposed between the source region and the drain region; wherein characteristics of a transistor formed on the upper surface of the element region are different from those of a transistor formed on the side surface of the element region.

A third aspect of the present invention provides a semiconductor device comprising: a substrate having a semiconductor element region of a projection shape; a gate electrode formed on an upper surface and a side surface of the element region via a gate insulation film; and a source region and a drain region, of a first conductivity type, provided so as to form a channel region on the upper surface of the element region in such a manner that the gate electrode is interposed between the source region and the drain region; wherein the source region and the drain region are formed on the upper surface and the side surface of the element region, and are not brought into contact with each other within a section of the projection shape.

A fourth aspect of the present invention provides a semiconductor device comprising: a substrate having a semiconductor element region of a projection shape; a gate electrode formed on an upper surface and a side surface of the element region via a gate insulation film; and a source region and a drain region, of a first conductivity type, provided so as to form a channel region on the upper surface of the element region in such a manner that the gate electrode is interposed between the source region and the drain region; wherein an electrode maintained at a constant potential is formed on a side portion of the drain region via an insulation film, and a width W of the element region of the projection shape satisfies the following equation (I):

$$W \leq 2\sqrt{2}(\epsilon_S \cdot \phi_F / q \cdot N_{sub})^{1/2} \quad (I)$$

where q represents an electron charge (coulomb), $\phi_F$ is a Fermi level (eV) of the semiconductor substrate, $\epsilon_S$ is a dielectric constant (farad/cm) of the semiconductor substrate and $N_{sub}$ is an impurity concentration (cm$^{-3}$) of the semiconductor substrate.

A fifth aspect of the present invention provides a semiconductor device comprising: a substrate having a semiconductor element region of a projection shape; a gate electrode formed on an upper surface and a side surface of the element region via a gate insulation film; a source region and a drain region, of a first conductivity type, provided so as to form a channel region on the upper surface of the element region in such a manner that the gate electrode is interposed between the source region and the drain region; and an electrode formed so as to cover a side portion of the drain region, and to be set at the same potential as that of the gate electrode.

BRIEF DESCRIPTION OF THE DRAWINGS

FIG. 8A is a sectional view showing one embodiment of semiconductor device in connection with the second embodiment of the present invention;

FIG. 8B is a view showing an expanse of a depletion region in a projection part of the semiconductor device shown in FIG. 8A;

FIGS. 9A trough 9C are characteristic charts showing drain current-gate voltage characteristics;

FIG. 17 is a sectional view showing an embodiment of a semiconductor device in connection with a fourth embodiment of the present invention;

FIG. 18 is a view to help explain a taper of a projection part in an element shown in FIG. 17;

FIGS. 19A and 21 are perspective views showing an embodiment of a semiconductor device in connection with the fifth embodiment of the present invention;

FIG. 19B is a sectional view taken along the line XIXB—XIXB of FIG. 19A;

FIG. 19C is a sectional view taken along the line XIXC—XIXC of FIG. 19A;

FIG. 21 is a view showing an embodiment of a semiconductor device in connection with the fifth embodiment of the present invention.

DETAILED DESCRIPTION OF THE PREFERRED EMBODIMENTS

Figure 1:
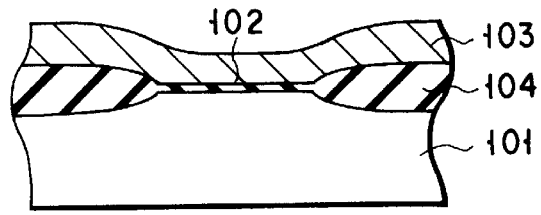
FIG. 1 is a sectional view showing a conventional semiconductor device.

In the present invention, as a semiconductor substrate, there can be used an SOI (Silicon On Insulator) substrate in which a semiconductor film such as a silicon film is formed on an insulating layer, and the like. As a material of a gate electrode, there can be used polysilicon, molybdenum, wolfram, MoSi$_2$, WSi$_2$, TiSi$_2$ and the like. As a material of gate insulating film, there can be used SiO$_2$ and the like. Also, as a material of an element isolation film, there can be used CVD-SiO$_2$, polysilicon, boron phosphorus glass (BPSG) and the like.

In the first and third aspects of the present invention, source and drain diffused layer regions are formed by doping an impurity in the upper part and side part of a projection-shaped element region. In this case, the source and drain diffused layer regions formed by an impurity introduced from the side part of the projection-shaped element region do not contact directly with each other, but connected with each other by the source and drain diffused layer regions formed by an impurity introduced from the upper part of the projection-shaped element region. Such a structure, that is, the structure in which the source and drain diffusion layer regions are formed on the upper and side surfaces of the projecting element region, is equivalent to a structure in which a shallow diffusion layer formed in a plain-type transistor.

In the first and third aspects, as a method of doping an impurity in a projection-shaped element region, there can be given a method of implanting ions from the diagonally upper side of the projection-shaped element region, a vapor phase diffusing method, a method combining the ion implanting method and a solid-phase diffusing method, and the like. Also, the conditions for these methods must be properly set.

In the first and third aspects of the present invention, the high concentration impurity region is formed within the portion having the projection shape and underneath the channel region. It is also preferable that the high concentration impurity region should be formed in the section of the element region, which is lower than the gate electrode. With the high concentration impurity region present at such a position, the creation of a depletion layer extending from the drain region underneath the gate electrode to the channel region can be suppressed, and the channel portion of the projection-type element region can be completely depleted. As a result, punch-through underneath the gate electrode can be prevented.

According to the first and third aspects, the source and drain diffused layer regions can be formed from the upper part and side part of the projection-shaped element region, so that a diffused layer may be formed in a region shallower than the channel surface while widening an effective element channel width. This allows a punch-through withstand voltage in the central part of the channel region hardly controlled by the gate electrode to be improved.

Also, according to the first and third aspects, a high-concentration impurity region containing an impurity which is of a conductivity type reverse to that of the source and drain diffused layer and has a concentration higher than that of channel region, is formed in the central part of the channel region, so that a depletion layer extending from the drain electrode to the channel region can be restrained, thereby allowing the short channel effect to be restrained in a region hard to be controlled by a gate electrode. Also, by properly selecting the kind and amount of an impurity introduced in a part connecting to the source and drain diffused layer and to the channel region in the above-mentioned channel central part, an increase in the junction capacitance between the diffused layer and the substrate can be prevented.

In the second aspect of the present invention, the characteristics of a transistor mean a threshold limit value, a mutual conductance and the like. In order to make the above-mentioned characteristics different between a transistor configured on the upper face of the element region and a transistor configured on the side face of the element region, at least one selected from a group consisting of the film thickness of a gate insulating film, the material of a gate insulating film and the material of a gate electrode is set in such a manner that the selected one on the upper part and side part of the element region are different from each other.

The second aspect of the present invention is characterized in that the characteristics of a transistor configured on the upper part of the element region is different from the characteristics of a transistor configured on the side part of the above-mentioned element region. By changing both the characteristics of a transistor configured on the upper part of the element region and the characteristics of a transistor configured on the side part, specifically on the corner part of the element region, an operation is made for all transistors as described below.

A gate electrode formed from the upper part to the side part of the element region gives a relatively large electric field to a part at which the upper part crosses the side part, that is, the corner part. As a result, a depletion layer larger in extension than the flat upper part occurs in the corner part of the element region. When depletion layers extending from respective corner parts in the width direction of the channel region overlap with each other, the depth of the depletion layer at the central part of the channel region in the width direction of the gate electrode becomes deeper than in a case where the gate electrode is provided on only the upper part of the element region. In such a state, the characteristics of a transistor depends on the transistor configured on the corner part.

Also, the transistor configured on the corner part has a larger dominant force of the gate electrode and a stronger electric field of the channel part compared with the transistor configured on the flat part (upper part), so that the effect of semiconductor substrate bias hardly appears. Therefore, when a depletion progresses and thus depletion layers extending from the side part approach mutually, a change in the electric field of the channel region compared to a change in gate voltage becomes larger, so that good cut-off characteristics are obtained. Also, element characteristics are changed largely by the length of the depletion layer extending from the corner part and the distance between the depletion layer and the one extending from another corner part.

Under such a principle of operation, by controlling separately the dominant forces of the gate electrodes on the corner part and the flat (upper face), a stable circuit operation can be executed without developing the element characteristics obtained by combining both transistor characteristics, the so-called hump characteristics.

In the fourth aspect of the present invention, as an insulating film formed on the side part of the drain region, an oxide film and the like can be used. Also, a material of an electrode held at a certain potential, polysilicon can be used.

In the fourth aspect, the electrode held at a certain potential is preferably connected electrically to the gate electrode.

The fourth aspect of the present invention is characterized in that an electrode held at a certain potential is formed through an insulating film on the side part of the drain region, and that the width W of the projection-shaped semiconductor element region satisfies $W \leq 2\sqrt{2} (\epsilon_S \cdot \phi_F / q_s \cdot N_{sub})^{1/2}$ (where, q is an electric charge (coulomb); $\phi_F$ is a Fermi level (eV) of a semiconductor substrate; $\epsilon_S$ a dielectric constant (farad/cm) of a semiconductor substrate; and $N_{sub}$ is an impurity concentration ($cm^{-3}$) of a semiconductor substrate).

By setting the width W of the element region in a manner to satisfy the above equation, all the channel region is depleted. Also, an electrode to shield an electric force line is formed on the side part of the drain region, so that the electric force line extending from the drain region does not extend in the source region direction, and the line almost terminates at the electrode on the side part. As a result, a reduction in the potential of the channel region due to the drain potential can be controlled and thus the short channel effect be effectively restrained.

Also, the present invention provides a semiconductor device which includes a substrate having a projection-shaped semiconductor element region, a gate electrode formed through a gate insulating film on the upper face and side face of the above-mentioned element region, a source region and a drain region provided on the upper face of the above-mentioned element region across the above-mentioned gate electrode, and an electrode which is formed in a manner to cover the side part of the above-mentioned drain region and can be set at the same potential as that of the above-mentioned gate electrode.

Also, in the fifth aspect of the present invention, as with the fourth aspect, the electric force line extending from the drain region can be made terminated at the electrode on the side part, thereby allowing the short channel effect to be restrained.

With reference to drawings, embodiments of the present invention will be specifically explained hereinafter.

[EMBODIMENT 1]

FIG. 3 is a view to help explain a manufacturing process of a semiconductor device in connection with the first embodiment of the present invention. First, as shown in FIG. 3A, a silicon oxide film 2 is formed to a thickness of about 10 nm on a silicon substrate 1 by the use of, for example, a thermal oxidation method. Then, by the use of a chemical vapor deposition method, a polysilicon film 3 is formed to a thickness of about 200 nm. Then, similarly by the use of the chemical vapor deposition method, a silicon oxide film 4 is formed to a thickness of about 200 nm on the polysilicon film 3. Further, a resist film 5 is formed on the silicon oxide film 4, and by the use of, for example, a photolithography method, patterning is performed to form an element isolation region with a desired geometry.

Figure 3A:
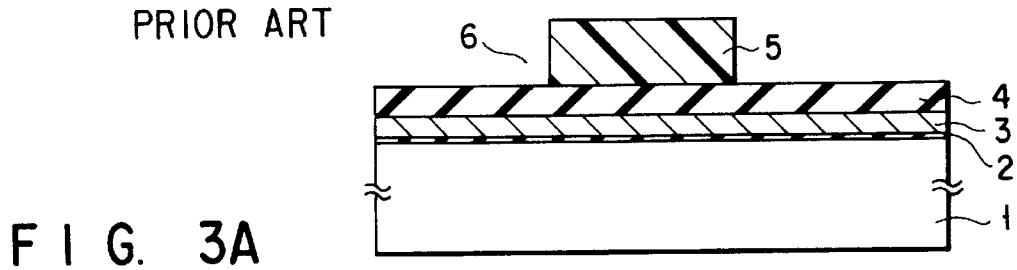
FIGS. 3A through 3G sectional views to help explain a manufacturing process of a semiconductor device in connection with the first embodiment of the present invention.
Figure 3B:
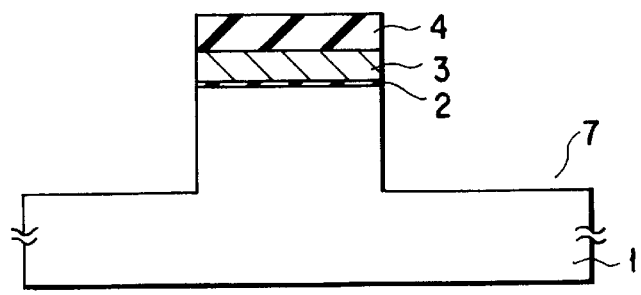

Then, utilizing the resist film 5 as a mask, the silicon oxide film 4 and the polysilicon film 3 are etched by the use of a sequential anisotropy etching method, for example, a reactive ion etching (RIE) method to process an opening 6, and the resist film 5 is separated. Thereafter, as shown in FIG. 3B, the silicon oxide film 2 at the opening 6 is removed by an $NH_4F$ solution and the like. Then, utilizing the silicon oxide film 4 as a mask, an element isolation groove 7 which becomes an element isolation region is formed to a depth of, for example, about 500 nm by the use of an anisotropy etching method such as RIE.

Then, after the silicon oxide film 4 is removed by an $NHP_4F$ solution and the like, for the purpose of removing a defect and the like occurring when the silicon substrate is etched, and of the like, a silicon oxide film 8 is formed to a thickness of about 10 nm by the use of a thermal oxidation method.

Figure 3C:
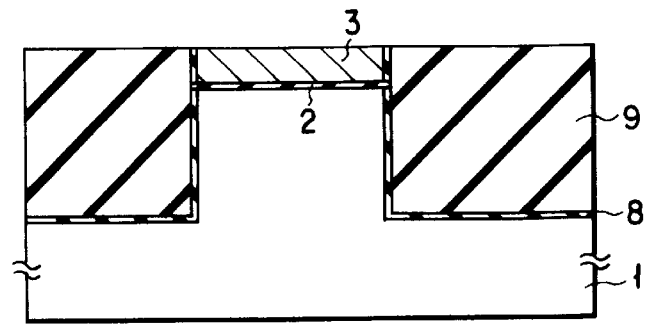
Figure 3D:
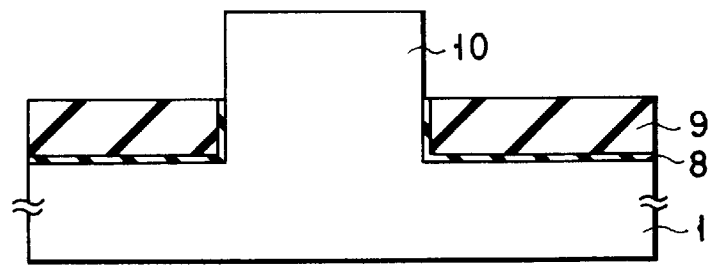

Then, as shown in FIG. 3C, by the use of a chemical vapor deposition method, for example, $SiO_2$ 9 as a filler is deposited to a thickness of about 1 $\mu$m on the element isolation groove 7. Thereafter, by the use of a method such as a reactive ion etching method and a CMP (Chemical Mechanical Polishing), the filler $SiO_2$ 9 is etched back to be substantially coplanar with the surface of the polysilicon film 3. Then, by the use of a method, for example, a CDE (Chemical Dry Etching), the exposed polysilicon film 3 is separated. Thereafter, as shown in FIG. 3D, by the etching utilizing a solution such as an $NH_4F$ solution, the surface of the element isolation region 9 is moved back, for example, by about 300 nm with respect to the surface of the channel forming region, thereby forming a projection-shaped silicon part 10 which becomes a channel region.

Figure 3E:
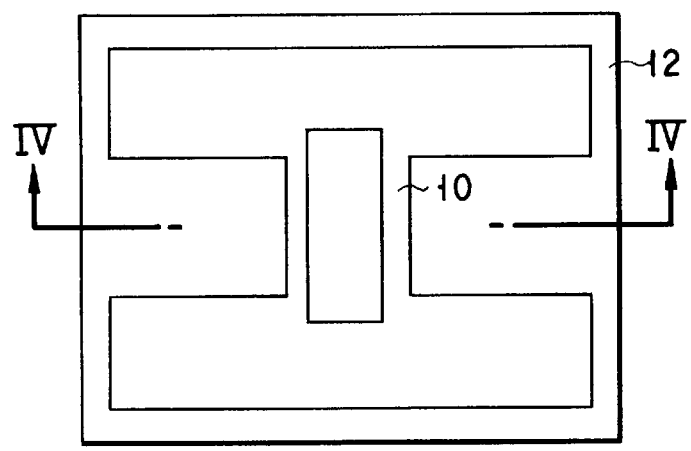

Then, as shown in the plan view of FIG. 3E, by the use of a method such as a thermal oxidation method, a thermal oxide film 11 is formed to a thickness of, for example, 10 nm on the surface of the projection-shaped silicon part 10. Thereafter, a resist film 12 is coated on the element channel region, and by the use of a method, for example, a photolithography method, the surface is patterned to a desired geometry.

Figure 4:
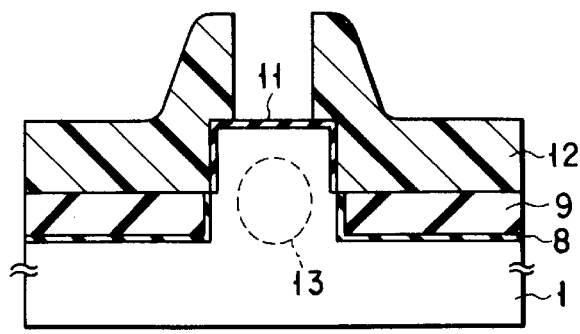
FIG. 4 is a sectional view taken along the line IV—IV of FIG. 3E.

Then, utilizing the above-mentioned resist film as a mask, and by the use of a method, for example, an ion implanting method, an impurity of the same conductivity type as the substrate is doped to form a high-concentration impurity region 13 in the projection-shaped silicon part 10 as shown in FIG. 4.

Figure 3F:
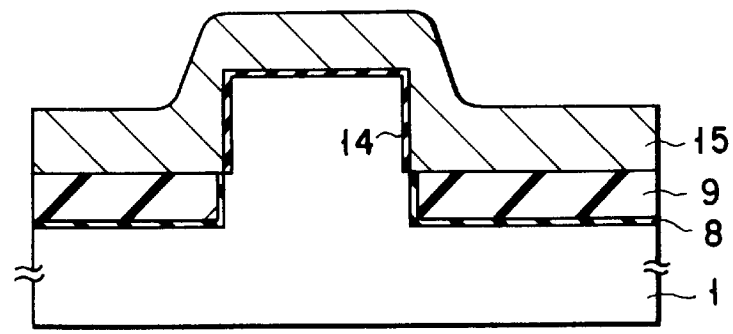

Thereafter, the resist film is removed; by an $NH_4F$ solution and the like, the oxide film on the surface of the projection-shaped silicon part 10 is separated; and again by the use of a thermal oxidation method and the like, a thermal oxide film 14 is formed to a thickness of, for example, 6 nm on the surface of the projection-shaped silicon part, and a polysilicon film 15 in which, for example, phosphorus is doped and which becomes a gate electrode is formed to a thickness of about 200 nm. Then, a resist film is coated on the polysilicon film 15, and by the use of a method, for example, a photolithography method, the surface is patterned into a desired pattern of the gate electrode. Then, by the use of a method, for example, an anisotropy etching method, the polysilicon film is etched to form a gate electrode as shown in FIG. 3F.

Figure 3G:
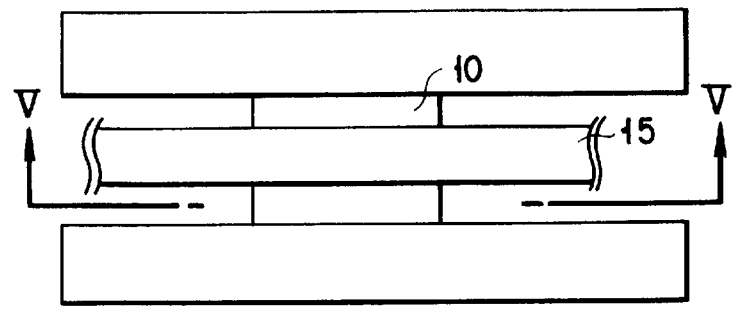
Figure 5:
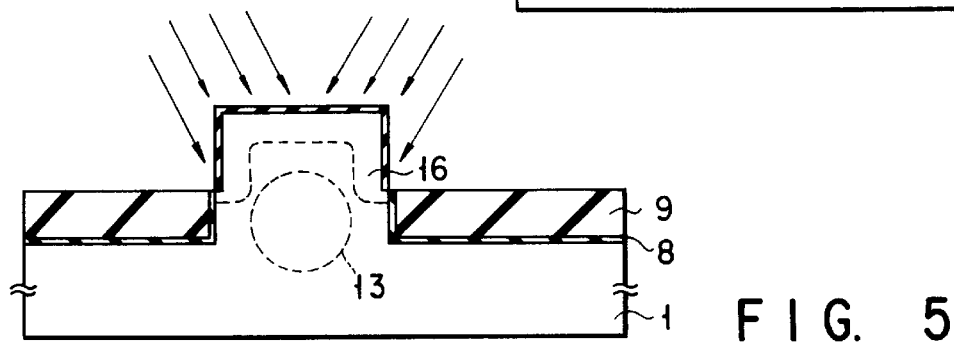
FIG. 5 is a sectional view taken along the line V—V of FIG. 3G.

Then, as shown in FIG. 3G, utilizing the gate electrode as a mask, an impurity is ion implanted in a self-matching fashion from the diagonally upper side of the element forming region to form a source electrode and drain electrode 16 as shown in FIG. 5. In this case, diffused layer regions formed by the impurity introduced from the side part of the projection-shaped silicon part forms a structure in which the regions do not contact with each other within the projection-shaped silicon part even after the following thermal process such as an activation process is finished, but contact with each other through a diffused layer region introduced from the upper part surface of the projection-shaped silicon part. In this structure, the depth of the diffused layer is determined by the conditions for the doping of an impurity introduced from the side part and upper part surface, for example, ion implanting conditions, and by the conditions for the diffusion by the following thermal process.

Thereafter, through a common process, for example, by the use of the CVD method, a silicon oxide film is deposited on an entire surface, and a contact hole reaching the source electrode, the drain electrode and the gate electrode is formed on the film, and an Al wiring is disposed to complete an element.

Figure 6:
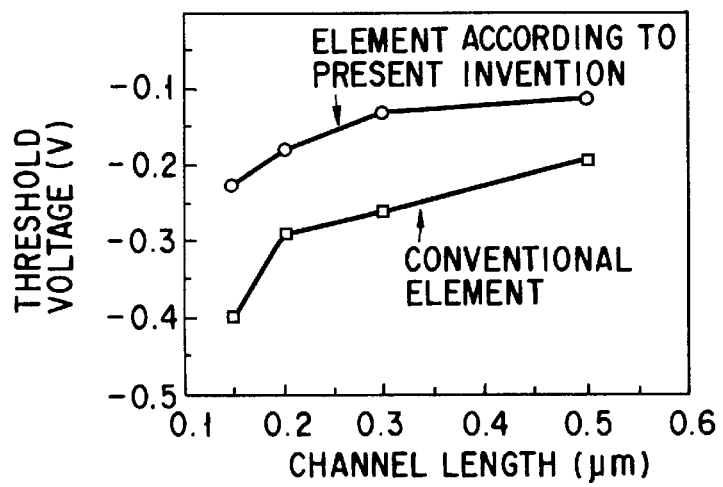
FIG. 6 is a graph showing a relationship between a channel length and a threshold voltage.

FIG. 6 shows a change in the threshold voltage with respect to the channel length of an element manufactured in the above-mentioned manner (in which an impurity of the same conductivity type as the substrate is introduced by about $1 \times 10^{18}$ cm$^{-3}$ between the source and drain electrodes within the channel). For comparison, FIG. 6 shows additionally the data of an element in which an impurity of the same conductivity type as the substrate is introduced by about $1 \times 10^{16}$ cm$^{-3}$ between the source and drain electrodes within the channel. As apparent from FIG. 6, the element in connection with the first invention of the present invention can restrain more effectively the short channel effect.

Figure 7:
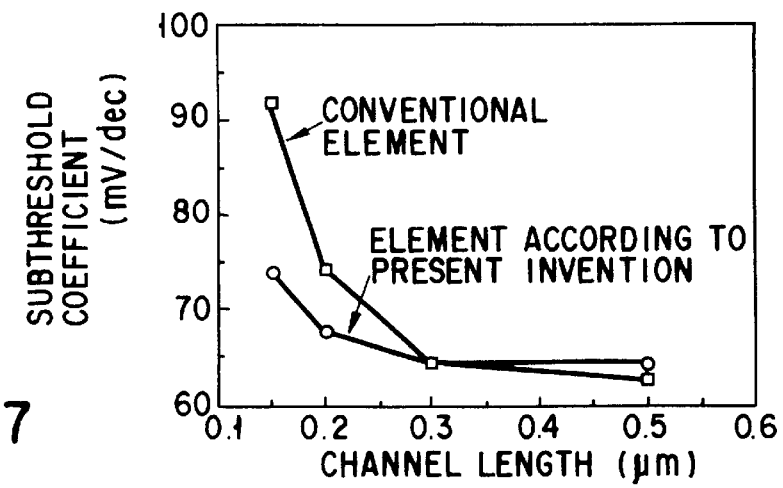
FIG. 7 is a graph showing a relationship between a channel length and a subthreshold coefficient.

Also, FIG. 7 shows a change in the subthreshold coefficient with respect to the channel length of an element manufactured in the above-mentioned manner (in which an impurity of the same conductivity type as the substrate is introduced to about $1 \times 10^{18}$ cm$^{-3}$ between the source and drain electrodes within the channel). Also here, for comparison, FIG. 7 shows additionally the data of an element in which an impurity of the same conductivity type as the substrate is introduced to about $1 \times 10^{16}$ cm$^{-3}$ between the source and drain electrodes within the channel. As apparent from FIG. 7, the element in connection with the first embodiment of the present invention can restrain more effectively a degradation in the subthreshold coefficient due to punch-through.

[EMBODIMENT 2]

FIG. 8A is a sectional view showing one embodiment of a semiconductor device (a MOS transistor) in connection with the second invention of the present invention. In the figure, reference code 21 designates a semiconductor substrate. In this embodiment, a P-type silicon substrate is used as the semiconductor substrate 21. The semiconductor substrate 21 is formed with a concavity and a projection, and a concavity part 22 corresponds to an element isolation region while a projection part 23 corresponds to an element region. The projection part 23 may be formed on the semiconductor substrate 21 by an epitaxial growth, or by an etching method. In this embodiment, the projection part 23 has a height of 0.6 $\mu$m and a width of 0.3 $\mu$m. Also, the P-type impurity concentration of the projection part 23 is about $5 \times 10^{15}$ cm$^{-3}$. Also, the projection part 23 is formed with a source region and a drain region, which are diffused layers of the N-type impurity, to a depth of 0.05 $\mu$m below the upper face of the projection part 23.

Formed on the concavity part 22 is an SiO$_2$ layer with a thickness 0.3 $\mu$m as an insulating film 24 in a manner to be recessed. Formed on the upper face and side face of the projection part 23 is a silicon oxide film as a gate insulating film 25. The thickness of the gate insulating film 25 is 12 nm for an upper face 25a and 6 nm for a side face 25b. Formed on the insulating film 24 and the gate insulating film 25 is a polysilicon layer as a gate electrode 26 in which phosphorus is doped and which has a thickness of 0.02 $\mu$m. In this manner, a semiconductor device (element) in connection with the second embodiment of the present invention is configured.

FIG. 8B shows an expanse of a depletion region occurring in the projection part 23 when a positive potential is applied to the gate electrode 26 of a transistor shown in FIG. 8A. As apparent from FIG. 8B, an extension I of the depletion region at the central flat part on the upper face of the projection part 23 is small compared with that on the side face and a corner part 27. For this reason, the characteristics of this transistor depends on the characteristics of the transistor on the corner part 27. Further, increasing the potential of the gate electrode 26 causes the depletion regions from the side face to be connected mutually, and thus to be hardly dominated by the gate electrode 26 formed on the upper face, so that thereafter the depletion region hardly extends. Therefore, all the extra increase of the potential of the gate electrode following the initial increase is consumed to form an inversion layer, so that the ratio of an increase in the carrier within the inversion layer to an increase in the gate voltage becomes large, and thus good cut-off characteristics are obtained.

Now, FIG. 9 shows typical drain current (I$_D$)-gate voltage (V$_G$) characteristics of a MOS transistor formed on a semiconductor substrate having a projection part. FIG. 9A shows the characteristics where a gate electrode is formed only on the flat part of the upper face of the projection part. In this case, the dominant force of the gate electrode is weak, so that the threshold limit value is somewhat high, about 0.7V. Also, in this case, the inclination of log I$_D$-V$_G$ characteristics is not steep. This tendency also appears similarly where the transistor configured on the upper face of the projection part is dominant. Such characteristics are observed where the extension of the depletion region from the side face by the potential of the gate electrode formed on the side face of the projection part is small.

On the other hand, where the dominant force of the gate electrode on the corner part is strong, the drain current-gate voltage characteristics become those shown in FIG. 9B. That is, the threshold limit value is low, and the inclination of log I$_D$-V$_G$ characteristics is steep. This tendency occurs where the depletion regions extending from the side face of the projection part are connected mutually. This is because an extra extension of the depletion region following that extension is restrained structurally, and thus as the gate voltage increases, the carriers in the inversion layer increases. Such characteristics occur only where the width of the gate electrode is relatively small. Where the width of the gate electrode is so wide that the depletion regions extending from the side face are not connected mutually, the drain current-gate voltage characteristics become those shown in FIG. 9C. That is, the characteristics become those in which the characteristic curve of FIG. 9A is overlapped on that of FIG. 9B. In this case, a hump occurs in the characteristic curve, so that an adverse effect might occur in the circuit operation.

For the structure shown in FIG. 8, the film thickness of the gate insulating film 25b formed on the side face of the projection part is thin, and thus the dominant force of the gate electrode formed on the side face is strong, so that the characteristics of the transistor configured on the corner part 27 mainly appear.

Figure 2A:
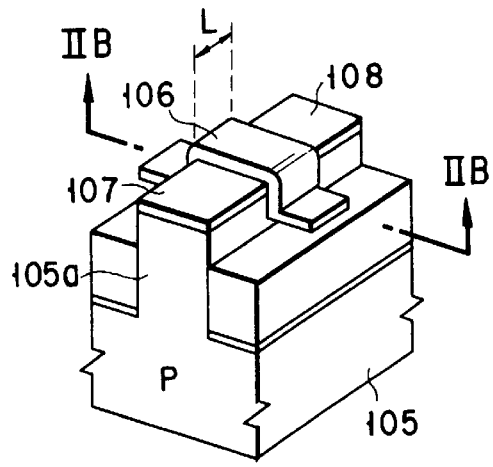
FIG. 2A is a perspective view showing a conventional semiconductor device.
Figure 2B:
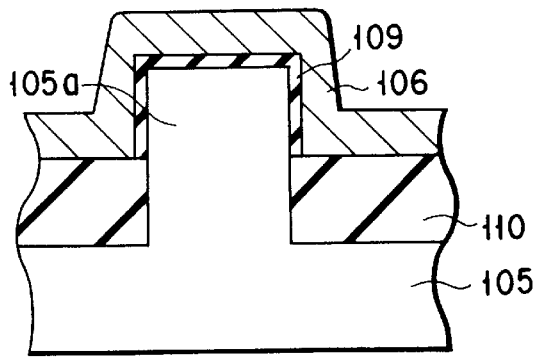
FIG. 2B is a sectional view taken along the line IIB—IIB of FIG. 2A.

Also, for the structure shown in FIG. 2, that is, for the structure in which the gate insulating films formed on the upper face and side face of the projection part are equal in thickness to each other, the electric field from both the gate electrodes on the upper face and side face is concentrated on the corner part, so that the characteristics of the transistor on the corner part appear relatively and mainly, while for the structure shown in FIG. 8, the tendency becomes more remarkable. Therefore, the structure shown in FIG. 8 keeps the characteristics of FIG. 9 more extensively to a region where the width of the gate electrode is wider and where the impurity concentration of the semiconductor substrate is higher. This shows that by changing the film thickness of the gate insulating film at the upper face and side face, the transistor characteristics can be changed. This causes the margin for circuit designing and the margin for threshold limit value setting to be expanded.

Figure 10:
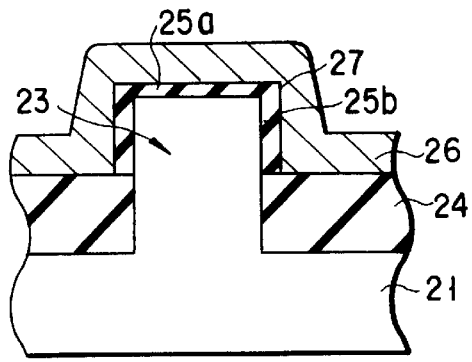
FIGS. 10 through 12 are sectional views showing another embodiment of a semiconductor device in connection with the second embodiment of the present invention.
Figure 11:
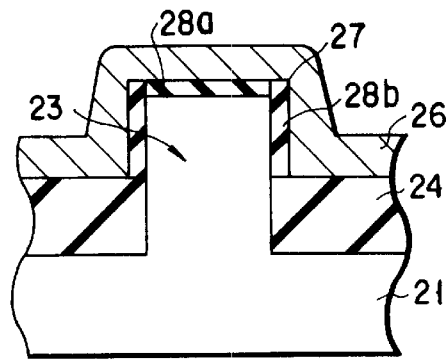
Figure 12:
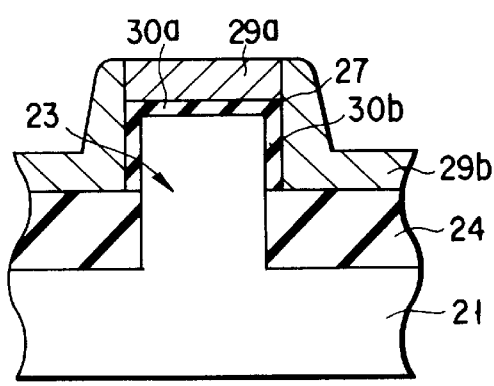

FIGS. 10 through 12 are sectional views showing another embodiment of a semiconductor device in connection with the second embodiment of the present invention. In FIG. 10, the film thickness of the gate insulating film 25a formed on the upper face of the projection part 23 is 6 nm, while the film thickness of the gate insulating film 25b formed on the side face of the projection part 23 is 12 nm. In this case, the dominant force of the gate electrode 26 formed on the side face becomes weak, so that the characteristics of the transistor configured on the corner part 27 become weak, and thus the characteristics of the transistor configured on the side face of the projection part 23 mainly appear. Therefore, where an element is required which is hardly affected by the transistor configured on the corner part 27, the structure shown in FIG. 10 is effective.

In FIG. 11, as a gate insulating film 28a formed on the upper face of the projection part 23, a silicon oxide film which has a specific inductive capacity of 3.9 and a thickness of 12 nm is used, while as a gate insulating film 28b formed on the side face of the projection part 23, a silicon nitride film-which has a specific inductive capacity of 7.5 and a thickness of 12 nm is used. In this case, the gate insulating film 28b formed on the side face of the projection part 23 has a specific inductive capacity,about two times that of the gate insulating film 28a formed on-the upper face of the projection part 23, so that the characteristics of the transistor configured on the corner part 27 mainly appear, and thus effectively almost the same results as obtained from the element having a structure,shown-in FIG. 8 are obtained. However, compared with the structure shown in FIG. 8, the film thickness of the gate insulating film 28b formed on the side face of the projection part 23 is two times that of the gate insulating film 25b, so that the reliability of the gate insulating film is improved. If there is no problem with the reliability, the film thickness of the gate insulating film 28b formed on the side face of the projection part 23 may be made thin, thereby allowing the characteristics of the transistor configured on the corner part 27 to be further enhanced.

In this structure, if the material of the gate insulating films 28a and 28b is made different from each other, many modified examples may be considered. For example, a silicon nitride film is used as the gate insulating film 28a formed on the upper face of the projection part 23, while a silicon oxide film is used as the gate insulating film 28b formed on the side face of the projection part 23, whereby the characteristics shown in FIG. 9A can be obtained. The material of the gate insulating films 28a and 28b can be obtained by properly selecting ones from a tantalum oxide film, a titanic acid strontium film, a ferroelectric film and the like, in addition to a silicon oxide film and a silicon nitride film, and combining therewith. In this case, the film thickness of the gate insulating films 28a and 28b can be arbitrarily selected, so that the width, threshold limit value and the like of the gate electrode may be freely specified in the circuit design.

In FIG. 12, polysilicon in which phosphorus has been doped is used as a gate electrode 29a formed on the upper face of the projection part 23, while a wolfram silicide is used as a gate electrode 29b formed on the side face of the projection part 23. Both of insulating films 20a and 20b formed on the upper face and side face of the projection part 23 have the same film thickness of 60 nm.

In this structure, due to the work function difference between the gate electrode 29a formed on the upper face of the projection part 23 and the gate electrode 29b formed on the side face, the threshold limit value of the transistor configured on the side face of the projection part 23 becomes higher by 0.4V than that of the transistor configured on the upper face of the projection part 23. Therefore, the element characteristics in this case become those as shown in FIG. 9A in which the characteristics of the transistor configured on the corner part 27 is weak, while the characteristics of the transistor configured on the upper face of the projection part 23 is strong. If the material of the gate electrodes on the upper face and side face of the projection part 23 is exchanged for each other, the element characteristics will become those as shown in FIG. 9B.

In this structure, it is sufficient that the material of the gate electrodes on the upper face and side face of the projection part 23 are different from each other, so that the material may be obtained by arbitrarily selecting ones from metallic material such as polysilicon, wolfram silicide or wolfram, and combining therewith.

An element shown in FIG. 12 is manufactured, for example, according to a process shown in FIGS. 13A through 13D. That is, first, as a gate insulating film 30a, a silicon oxide film having a thickness of 12 nm is formed by a thermal oxidation on the upper face of the projection part 23 of the semiconductor substrate 21. Then, as the gate electrode 29a, a polysilicon film which has a thickness of 200 nm and in which phosphorus has been doped by the CVD method is formed on the gate insulating film 30a. Further, a silicon oxide film 31 having a thickness of 200 nm is formed by the CVD method.

Figure 13A:
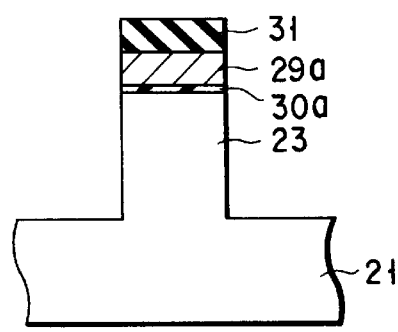
FIGS. 13A through 13D are manufacturing process views of the semiconductor device shown in FIG. 12.

Then, a resist layer is formed by a photolithography method, and utilizing the photoresist pattern as a mask, the silicon oxide film 31 is etched by the RIE method. Then, as shown in FIG. 13A, after the resist layer is removed, utilizing the etched silicon oxide film 31 as a mask, the polysilicon film, the thermally-oxidized silicon oxide film and the semiconductor substrate 21 are etched by the RIE method. The depth to etch the semiconductor substrate 21 is set at 0.6 μm. The thermally-oxidized silicon oxide film is very thin, so that the film can be processed simultaneously with the other polysilicon film and semiconductor substrate without employing a special technique.

Figure 13B:
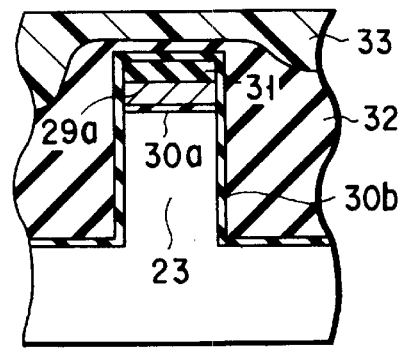
Figure 13C:
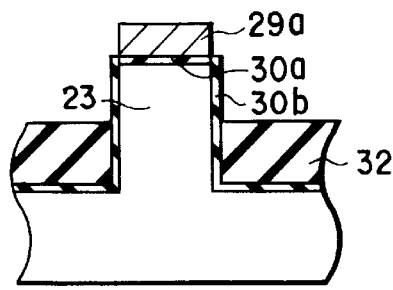
Figure 13D:
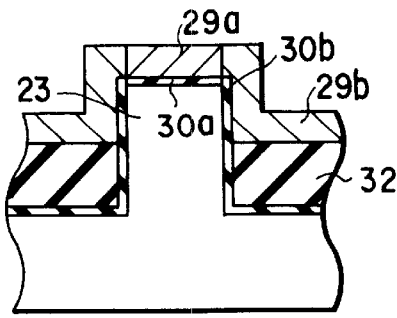

Then, as shown in FIG. 13B, as a gate insulating film 30b, a silicon oxide film having a thickness of 10 nm is formed by a thermal oxidation on the surface. Then, a silicon oxide film 32 having a thickness of 1 μm is formed by the CVD method, and a resist layer 33 to make the surface flat is formed and allowed to flow. Then, as shown in FIG. 13C, etching by the RIE method is performed in such a manner that the silicon oxide film 32 is allowed to remain to a thickness of 0.3 μm above the bottom of the concavity part of the semiconductor substrate 21. At this point, the silicon oxide film 31 above the polysilicon film is removed simultaneously with etching back.

Finally, after a wolfram silicide 34 having a thickness of 100 nm is formed by the CVD method or a spattering method on the surface, patterning is performed by the photolithography method, and RIE is performed to process the element into a desired gate electrode pattern. In this manner, the element having a structure shown in FIG. 12 is obtained.

By forming no polysilicon film as the gate electrode 29a in FIG. 13A, or adding a process to remove the polysilicon film in FIG. 13C, an element can be manufactured in which only the film thickness of the gate oxide film on the upper face and the side face is different from each other such that the film thickness of the gate oxide film on the upper face of the projection part 23 becomes thinner than that on the side face of the projection part 23. Further, where a thermal nitriding process instead of the thermal oxidation process of FIG. 13B is performed, only the gate insulating film formed on the side face of the projection part 23 can be made a silicon nitride film. Also, the gate insulating film formed on the side face of the projection part 23 may be formed by deposition of the CVD method rather than the thermal oxidation method. In this case, the process can be implemented by forming, for example, a tantalum oxide film having a thickness of 20 nm on the entire surface in FIG. 13C, and allowing the tantalum oxide film to remain only on the side face of the projection part 23 by the RIE method. In this manner, by previously forming the gate insulating film at least on the upper face of the projection part 23, a desired element structure can be implemented by a simple process.

Further, in the second embodiment of the present invention, by changing at least one of parameters of the film thickness of the gate insulating film, the material of the gate insulating film and the material of the gate electrode on the upper face and side face of the projection part 23, an effect is exhibited, so that even where two or more of the above-mentioned parameters are combined and applied, the effect of the present invention is exhibited. Also, within one LSI chip, elements in which the film thickness of the gate insulating film, the material of the gate insulating film and the material of the gate electrode on the upper face and side face of the projection part have been changed, and elements in which the parameters have not been changed may be mixed with each other.

[EMBODIMENT 3]

In the projection-shaped transistor as shown in FIG. 2A, the contact wiring to the source region 107 and the drain region 108 is manufactured normally by patterning the gate electrode 106, forming the source region 107 and the drain region 108, forming an inter-layer insulating film, forming a contact hole by the photolithography method, and then forming a contact wiring layer. In this case, if the position of the contact hole or the projection part 105a is dislocated, there will be a problem that the contact area of the source region 107 and the drain region 108 with the contact wiring layer is reduced to cause the contact resistance to be increased.

Figure 14:
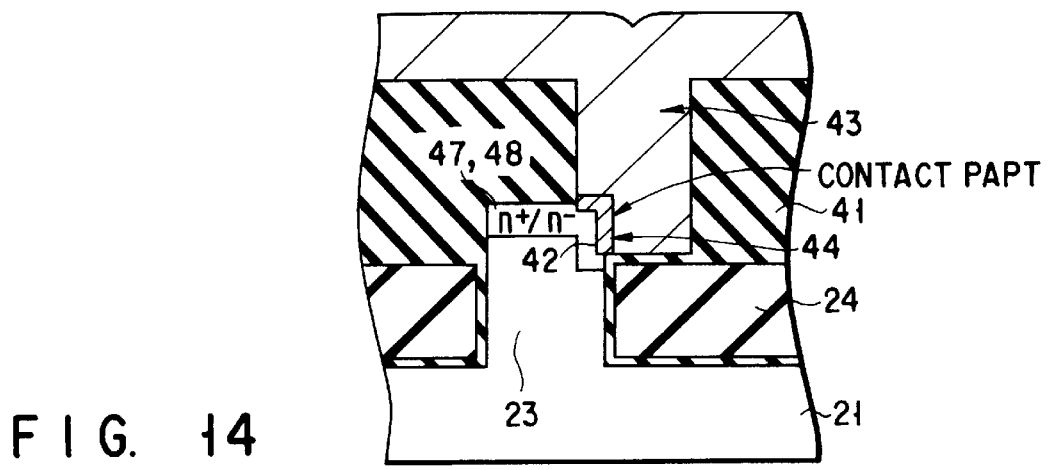
FIGS. 14, 15A and 15B are sectional views showing a semiconductor device of a third embodiment 3 of the present invention.

Therefore, in the semiconductor device in connection with the present invention, the contact wiring as shown in FIG. 14 is preferably formed. That is, first, an element is manufactured in the above-mentioned manner. As the insulating film 24, other than a silicon oxide film, there may be used a silicon oxide-based film formed by the use of a gas such as LP-TEOS and TEOS-$O_3$.

Then, an inter-layer insulating film 41 such as a silicon oxide film is formed on the entire surface of the element; a resist is further formed on the insulating film 41; the above-mentioned resist is patterned by the photolithography method; and utilizing the resist pattern as a mask, anisotropic etching is performed to form the contact hole. Then, after the resist is removed, a polysilicon film or an amorphous silicon film having a thickness of 30 so 100 nm is formed conformably. Then, a mask is formed by the photolithography method; and using the mask, ion implantation is performed, whereby an impurity with a high-concentration exceeding a solid solution limit is introduced into the polysilicon film or the amorphous silicon film formed on a region 42 in which a contact is formed. In this case, when the contact for an $N^-/N^+$-type diffused layer is formed, as the impurity, the one indicating an N-type conductivity type such as phosphorous and arsenic is used, while when the contact for a $P^-/P^+$-type diffused layer is formed, as the impurity, the one indicating a P-type conductivity type such as boron is used.

Thereafter, by the use of a rapid thermal anneal (RTA) method or a method employing a common diffusion furnace, the impurity introduced into the polysilicon film or the amorphous silicon film is diffused in a solid phase, whereby a source region 47 and a drain region 48 are formed in a self-matching fashion with respect to the contact hole. Then, the polysilicon film or the amorphous silicon film is entirely or selectively removed to form a contact wiring layer 43 according to a common contact wiring technique. In this manner, the contact wiring as shown in FIG. 14 can be formed.

Figures 15A, 15B:
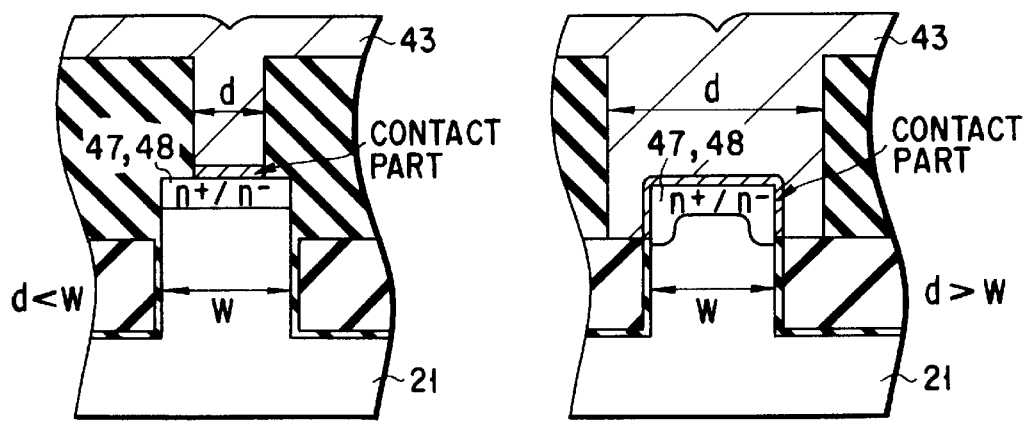

According to the above-mentioned method, elements can be implemented which have mutually different drive capabilities by the use of the projection part 23 having the same width. That is, for an element not requiring a large drive capability, as shown in FIG. 15A, the contact wiring is performed by a contact hole having a width equal to or narrower than the width of the upper face of the projection part 23, while for an element requiring a large drive capability, as shown in FIG. 15B, the contact wiring is performed by a contact hole having a width wider than the width of the upper face of the projection part 23. In this manner, an effective channel width of an element can be controlled by the size of the contact hole. Also, according to the above-mentioned method, even when the contact hole is formed dislocatedly with respect to the source region 47 and the drain region 48, an increase in the contact resistance can be restrained as low as possible. Also, in the element manufactured according to the above-mentioned method, the source region 47 and the drain region 48 are formed in a self-matching fashion with respect to the contact hole.

Figures 16A, 16B:
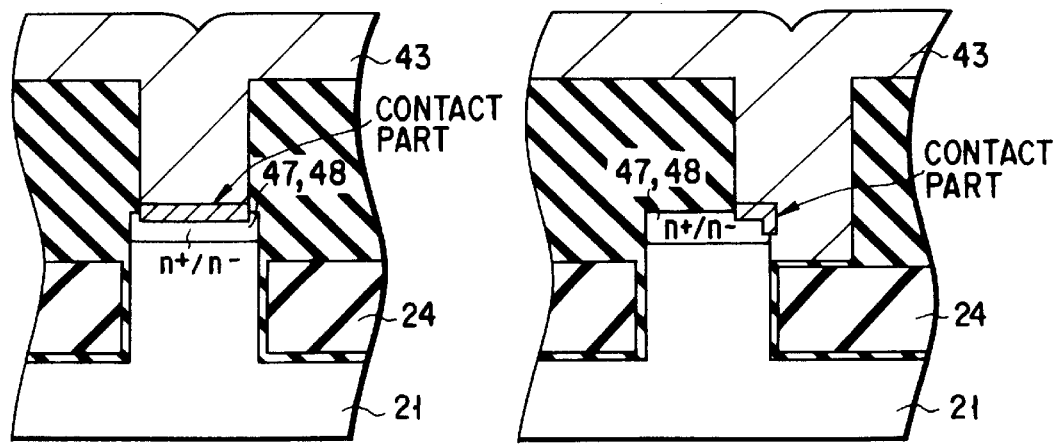
FIG. 16A is a sectional view showing a normal contact state of a conventional semiconductor device.
FIG. 16B is a sectional view showing a normal contact state where a conventional semiconductor device has a dislocation.

Advantages of the element having the structure can be understood by comparing FIG. 14 with FIG. 16B. That is, in a conventional projection-shaped transistor, unlike a normal case of FIG. 16A, as shown in FIG. 16B, when the source region 47 and the drain region 48 are dislocated with respect to the contact hole, the area of the contact part is reduced, and thus an effect due to an incidental resistance appears in the element characteristics. On the other hand, in the element manufactured according to the above-mentioned method, as shown in FIG. 15, the source region 47 and the drain region 48 are formed in a self-matching fashion with respect to an entire source region 44 of the projection part 23 opened by the contact hole, so that the contact area of the contact wiring layer 43 with the source region 47 and the drain region 48 is not reduced extremely, and thus a degradation of the element characteristics due to an increased contact resistance can be restrained at the minimum. In the above-mentioned method, the element structure thus formed changes according to the presence/absence of a dislocation of the contact hole with respect to the source region 47 and the drain region 48.

[EMBODIMENT 4]

FIG. 17 is a perspective view showing a semiconductor device (a MOS transistor) in connection with the third aspect of the present invention.

The element is manufactured in such a manner that a P-type silicon substrate 51 having an impurity concentration of $1 \times 10^{16}$ $cm^{-3}$ is etched to a depth of 0.7 $\mu$m to form a projection part 52 having a width of 0.1 $\mu$m; an insulating film 53 is disposed in an element isolation region; the insulating film 53 is etched to a depth of 0.3 $\mu$m below the upper face of the projection part; then, boron is ion implanted into the projection part 52 to form a P-type impurity layer 54 having an impurity concentration of $1 \times 10^{18}$ $cm^{-3}$ deeper than the depth of 0.3 $\mu$m below the upper face of the projection part 52 (deeper than the upper face of the insulating film 53 in FIG. 17); then, a gate electrode 56 is formed through a gate insulating film 55 having a thickness of 4 nm; and finally a source region 57 and a drain region 58 are formed.

According to the element having the structure, the high-concentration P-type impurity layer 54 does not contact the source region 57 and the drain region 58, so that the concentration of the P-type impurity layer 54 can be increased limitlessly without degrading the diffused layer withstand voltage, and thus an effect of restraining the short channel effect is increased significantly and in addition, the diffused layer capacity can be reduced.

Although in this embodiment, NMOS is explained, PMOS can be also manufactured in a similar manner. Also, it is sufficient that the concentration of the impurity layer as a channel region is a concentration at which the entire projection part 52 is completely depleted by a voltage applied to the gate electrode on the side face of the projection part 52. Also, although in this embodiment, an etching method is used to form the projection part 52, the projection part 52 may be formed by an epitaxial growth method. In this case, a P-type doped epitaxial layer may be used as the P-type impurity layer 54.

In this embodiment, when the projection part 52 is formed, for example, as shown in FIG. 18, a forward taper of 100° is preferably provided. This can prevent the gate electrode from remaining on the side face of the projection part 52 after the gate electrode 56 is formed, and the gate electrodes 56 from shorting together.

In the third aspect of the present invention, the contact wiring shown in the third embodiment may be also formed.

However, in this case, it is necessary to have a structure in which a junction withstand voltage between the drain region and the semiconductor substrate is not lowered due to contact.

In this embodiment, the region of a relatively high impurity concentration is preferably formed in the element region lower than the gate electrode. The position lower than the gate electrode means that lower than the upper face of a field oxide film which becomes an element isolation region.

In this embodiment, the impurity concentration of the region having a impurity concentration higher than the channel region must satisfy the conditions on which the short channel effect such as punch-through is restrained, while the impurity concentration of the channel region must be made low enough so as to completely deplete the channel region by the gate voltage.

This embodiment is characterized in that the region of a relatively high impurity concentration is formed in the element region below the channel region of the projection part. In the present invention, the channel region is completely depleted, so that the short channel effect is restrained and thus the carrier mobility is improved, and in addition, the above-mentioned the region of a high impurity concentration allows the punch-through withstand voltage between the source region and the drain region to be improved.

[EMBODIMENT 5]

FIG. 19A is a perspective view showing an embodiment of a semiconductor device (a MOS transistor) in connection with the fourth aspect of the present invention. Also, FIGS. 19B and 19C are sectional views taken along the line XIXB—XIXB and the line XIXB—XIXB of FIG. 19A, respectively.

In the figures, reference numeral 61 designates a semiconductor substrate having a projection part 62. Formed on the semiconductor substrate 61 is a gate electrode 64 through a gate insulating film 63. The gate electrode 64 is formed with an opening 65 reaching a diffused layer formed on the projection part 62, and the region becomes a drain region 66. Further, a source region 68 is formed across a channel region 67.

Figure 20A:
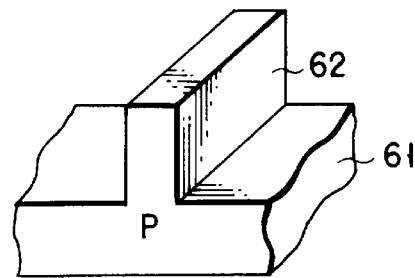
FIGS. 20A through 20C are views to help explain a manufacturing process of the semiconductor device shown in FIG. 19.
Figure 20B:
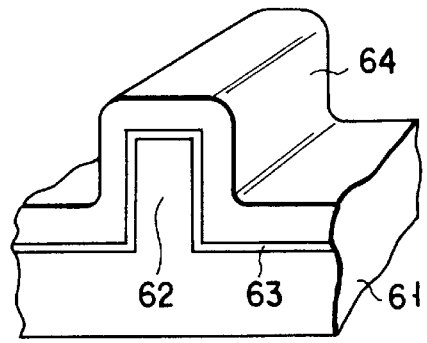
Figure 20C:
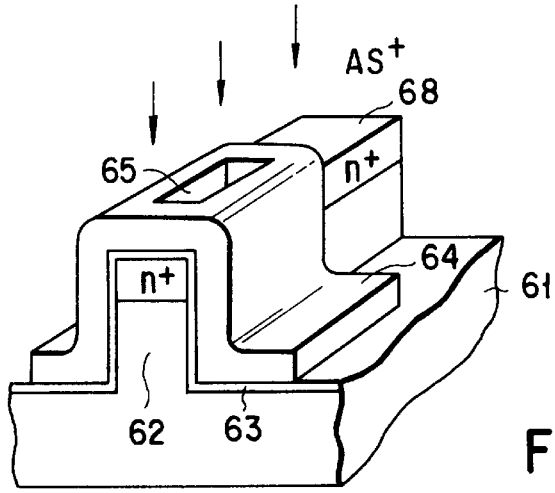

The element having such a structure can be manufactured according to FIGS. 20A through 20C. That is, as shown in FIG. 20A, by the use of the well-known electron beam irradiation method, a resist layer is formed in a region which becomes a channel region and has a width 0.25 $\mu$m and a length 1.5 $\mu$m on the surface of a silicon substrate (100) which is the semiconductor substrate 61 and has a P-type impurity of $1 \times 10^{16}$ cm$^{-3}$, and then by the use of the RIE method, the silicon projection part 62 having a height of 0.5 $\mu$m is formed. Then, as shown in FIG. 20B, by the use of the thermal oxidation, gate oxide film 63, a silicon oxide film having a thickness of 10 nm is formed on the semiconductor substrate 61, and further gate electrode 64, a polysilicon film in which phosphorus has been doped is formed on the silicon oxide film and patterned by the electron beam irradiation. In this state, the gate electrode allows the polysilicon film to remain not only in the channel region but also on the side face of the drain region 66. Then, as shown in FIG. 20C, by the use of the RIE method, the opening 65 is formed in a polysilicon film on the drain region 66; arsenic is ion implanted at an accelerating voltage 50 kV and with a dose amount $2 \times 10^{15}$ cm$^{-3}$, and an anneal processing is applied at a temperature 900° C. for one hour, whereby the source region 68 and the drain region 66 both having a depth 0.2 $\mu$m are formed. Thereafter, contact holes and contact wiring for the source region 68, the drain region 66 and the gate electrode 64 are formed by the use of the electron beam irradiation method. At this point, the width W of the projection part 62 is set so that the width W satisfies $W \leq 2\sqrt{2} (\epsilon_S \cdot \phi_F / q_S \cdot N_{sub})^{1/2}$ (where, q is an electric charge (coulomb); $\phi_F$ is a Fermi level (eV) of a semiconductor substrate; $\epsilon_S$ is a dielectric constant (farad/cm) of a semiconductor substrate; and $N_{sub}$ is an impurity concentration (cm$^{-3}$) of a semiconductor substrate).

As described above, in this embodiment, the gate electrode 64 is also formed on the side face of the drain region 66, and the width W of the projection-shaped element region satisfies the above equation. Therefore, needless to say that the entire channel region is depleted., the electrode for shielding the electric force line is formed on the side face of the drain region, so that the electric force line extending from the drain region does not extend in the source region-direction and almost terminates at the electrode on the side face. As a result, a reduction in the potential of the channel region due to the drain potential can be restrained, and thus the short channel effect be effectively restrained.

The measurement of the short channel effect of the element manufactured in the above-mentioned manner and of the conventional element found that for the conventional element, the threshold limit value was lowered due to the short channel effect at a channel length 0.4 $\mu$m, while for the element of the present invention, the threshold limit value was not lowered at a channel length of up to 0.25 $\mu$m.

In this embodiment, the width of the projection part 62 is 0.2 $\mu$m, and the film thickness of the gate oxide film 63 is 10 nm. It is apparent that the width of the projection part 62 is narrower, or the film thickness of the gate oxide film 63 is thinner, whereby the restraint of the short channel effec covers a shorter channel length.

Figure 21:
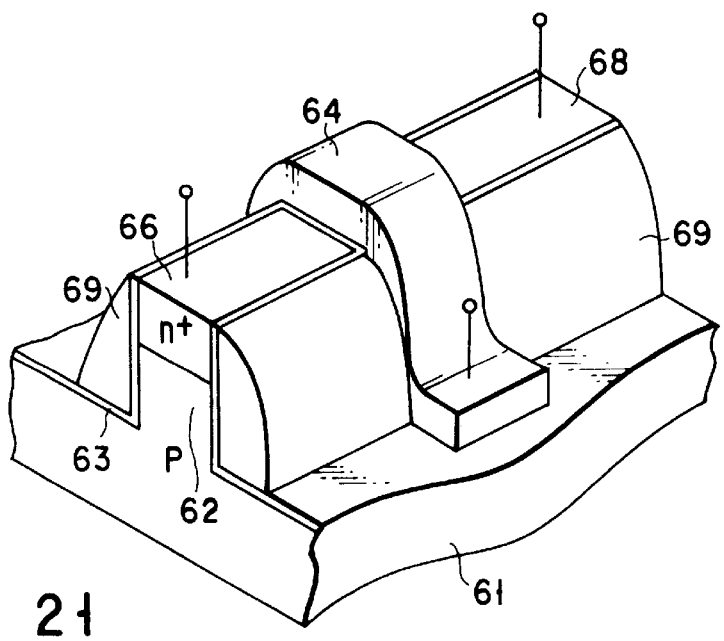

FIG. 21 is a perspective view showing an embodiment of a semiconductor device in connection with the fourth aspect of the present invention. The structure utilizes a remaining film portion on the side face of the gate electrode 64 by the RIE. That is, a mask pattern is provided on the gate electrode, and by the use of a common anisotropic etching such as the RIE, the conditions of the anisotropic etching are properly selected, whereby the gate electrode 64 can be formed while allowing a gate electrode 69 to remain on the side face of the projection part 62 of the drain region 66. In this case, although the gate electrode 69 is also formed on the side face of the projection part 62 of the source region 68, there is no particular problem in the sense of the restraint of the short channel effect.

It is appreciated that the present invention is not limited to the above-mentioned embodiments, and applicable to any of the P-channel MOSFET and the N-channel MOSFET, and in addition, various modifications thereof can be embodied.

Also, the present invention is effectively applicable to, for example, a region in which a narrow channel width is required in the cell part and the like of a semiconductor memory. In this case, an SOI substrate is used as a substrate, an element in connection with the present invention is used for a memory cell part, and a partially depleted element is applied to a peripheral element part, whereby a semiconductor device can be implemented which operates at a high rate and at a high density.

As explained above, the semiconductor device of the first aspect of the present invention is configured such that in the projection-shaped transistor, a high-concentration impurity region containing a second conductivity type impurity at a concentration higher than that on the surface of the above-mentioned channel region is provided in a central part of the above-mentioned projection-shaped semiconductor element region, whereby a current drive capability of the element can be increased by a three-dimensional expanse, and the short channel effect and the punch-through can be prevented without limiting the characteristics of the channel depletion type element, and in addition, fine configuring of the element can be implemented.

Also, the semiconductor device of the second aspect of the present invention is configured such that in the projection-shaped transistor, the characteristics of transistors configured on the upper face of the element region are different from those of transistors configured on the side face of the element region, so that the degree of freedom for the threshold limit value setting and for the circuit pattern designing is increased, and thus the element characteristics can be selected according to the circuit purpose, thereby allowing the integrated circuit performance to be improved.

Also, the semiconductor device of the third aspect of the present invention is configured such that in the projection-shaped transistor, a relatively high impurity concentration region is provided below the channel region, so that the channel region has been completely depleted, and thus an effect of restraining the short channel effect is increased, and in addition, an impurity carrier diffusion can be also reduced and a high-rate operation can be executed.

Also, the semiconductor device of the fourth aspect of the present invention is configured such that in the projection-shaped transistor, an electrode held at a certain potential is formed through an insulating film on the side part of at least the region applying a high potential, of the source region and the drain region, and that the width W of the projection-shaped semiconductor element region satisfies $W \leq 2\sqrt{2} (\epsilon_S \cdot \phi_F / q_S \cdot N_{sub})^{1/2}$ (where, q is an electric charge (coulomb); $\phi_F$ is a Fermi level (eV) of a semiconductor substrate; $\epsilon_S$ is a dielectric constant (farad/cm) of a semiconductor substrate; and $N_{sub}$ is an impurity concentration (cm$^{-3}$) of a semiconductor substrate), so that a transistor which is finely configured and has a large drive force can be implemented, and in addition, a high-density, high-performance integrated circuit can be implemented.

What is claimed is:

1. A semiconductor device comprising:
   a substrate having a semiconductor element region of a projection shape;
   a gate electrode formed on an upper surface and a side surface of said element region via a gate insulation film; and
   a source region and a drain region, of a first conductivity type, provided so as to form a channel region in the upper surface of the element region in such a manner that said gate electrode is interposed between the source region and the drain region;
   wherein said semiconductor device comprises a high concentration impurity region formed within a section of the projection shape and spaced from said channel region, having an impurity of a second conductivity type at a concentration higher than that of the channel region, and a width narrower than a channel width of said channel region.

2. A semiconductor device according to claim 1, wherein said high concentration impurity region is formed in a portion of the projection shape, which is located lower than said gate electrode.

3. A semiconductor device according to claim 1, wherein said high concentration impurity region is formed at a center of the section of the projection shape.

4. A semiconductor device comprising:
   a substrate having a semiconductor element region of a projection shape;
   a gate electrode formed on an upper surface and a side surface of said element region via a gate insulation film; and
   a source region and a drain region, of a first conductivity type, provided so as to form a channel region on the upper surface of the element region in such a manner that said gate electrode is interposed between the source region and the drain region;
   wherein an electrode maintained at a constant potential is formed on a side portion of said drain region via an insulation film, and a width W of the element region of the projection shape satisfies the following equation (I):

$$W \leq 2\sqrt{2} (\epsilon_S \cdot \phi_F / q \cdot N_{Sub})^{1/2} \qquad (I)$$

where q represents an electron charge (coulomb), $\phi_F$ is a Fermi level (eV) of the semiconductor substrate, $\epsilon_S$ is a dielectric constant (farad/cm) of the semiconductor substrate and $N_{sub}$ is an impurity concentration (cm$^{-3}$ of the semiconductor substrate.

5. A semiconductor device according to claim 4, further comprising a high concentration impurity region formed within a section of the projection shape and underneath said channel region, and having an impurity of a second conductivity type at a concentration higher than that of the channel region.

6. A semiconductor device according to claim 5, wherein said high concentration impurity region is formed at a center of the section projection shape.

7. A semiconductor device according to claim 5, wherein said high concentration impurity region is formed in a portion of the projection shape, which is located lower than said gate electrode.

8. A semiconductor device comprising:
   a substrate having a semiconductor element region of a projection shape;
   a gate electrode formed on an upper surface and a side surface of said element region via a gate insulation film;
   a source region and a drain region, of a first conductivity type, provided so as to form a channel region on the upper surface of the element region in such a manner that said gate electrode is interposed between the source region and the drain region; and
   an electrode formed so as to cover a side portion of said drain region, and to be set at the same potential as that of said gate electrode.

9. A semiconductor device according to claim 8, further comprising a high concentration impurity region formed within a section of the projection shape and underneath said channel region, and having an impurity of a second conductivity type at a concentration higher than that of the channel region.

10. A semiconductor device according to claim 9, wherein said high concentration impurity region is formed at a center section of the projection shape.

11. A semiconductor device according to claim 9, wherein said high concentration impurity region of the second conductivity type is formed in a portion of the projection shape, which is located lower than said gate electrode.

12. A semiconductor device comprising:
   a substrate having a semiconductor element region of a projection shape;
   a gate electrode formed on an upper surface and a side surface of said element region via a gate insulation film; and a source region and a drain region, of a first conductivity type, provided so as to form a channel region on the upper surface of the element region in such a manner that said gate electrode is interposed between the source region and the drain region;

wherein characteristics of a part of the channel region formed on the upper surface of said element region are different from another part of the channel region formed on a side surface of said element region; and wherein a first portion of the gate electrode and gate insulation film formed on said upper surface of said element region differs from a second portion of the gate electrode and gate insulation film formed on the side surface thereof in at least one aspect selected from the group consisting of a thickness of said gate insulator film, a material of the gate insulation film and a material of the gate electrode.

13. A semiconductor device according to claim 1, comprising:

said high concentration impurity region having a width in a channel width direction narrower than said width of said channel.

14. A semiconductor device according to claim 12, further comprising a high concentration impurity region formed within a section of the projection shape and underneath said channel region, and having an impurity of a second conductivity type at a concentration higher than that of the channel region.

15. A semiconductor device according to claim 14, wherein said high concentration impurity region is formed at a center of the section of the projection shape.

16. A semiconductor device according to claim 12, wherein said high concentration impurity region is formed in a portion of the projection shape, which is located lower than said gate electrode.

* * * * *